United States Patent
Shin et al.

(10) Patent No.: US 10,902,773 B2
(45) Date of Patent: Jan. 26, 2021

(54) DISPLAY DEVICE

(71) Applicant: SAMSUNG DISPLAY CO., LTD., Yongin-si (KR)

(72) Inventors: Jae Min Shin, Yongin-si (KR); Sang Woo Kim, Yongin-si (KR); Jong Ho Hong, Yongin-si (KR); Min Woo Kim, Yongin-si (KR); Won Sang Park, Yongin-si (KR); Jun Hyeong Park, Yongin-si (KR); Hye Jin Joo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/266,620

(22) Filed: Feb. 4, 2019

(65) Prior Publication Data

US 2019/0311674 A1    Oct. 10, 2019

(30) Foreign Application Priority Data

Apr. 5, 2018    (KR) .................. 10-2018-0039825

(51) Int. Cl.
  *G09G 3/3233*    (2016.01)
  *G09G 3/3266*    (2016.01)
  *G09G 3/3275*    (2016.01)

(52) U.S. Cl.
  CPC ......... *G09G 3/3233* (2013.01); *G09G 3/3266* (2013.01); *G09G 3/3275* (2013.01); *G09G 2310/08* (2013.01); *G09G 2320/0233* (2013.01); *G09G 2330/02* (2013.01)

(58) Field of Classification Search
  CPC ....... G09G 2300/0426; G09G 2310/08; G09G 2320/0233; G09G 2330/02; G09G 2330/028; G09G 3/3233; G09G 3/3266; G09G 3/3275; H01L 27/32; H01L 27/3227

See application file for complete search history.

(56) References Cited

U.S. PATENT DOCUMENTS

| | | | |
|---|---|---|---|
| 8,773,365 B2 | 7/2014 | Hong et al. | |
| 2004/0189625 A1* | 9/2004 | Sato ................ | G06K 19/07749 345/204 |
| 2005/0270757 A1* | 12/2005 | Credelle .......... | G06K 19/07749 361/767 |
| 2007/0247449 A1 | 10/2007 | Mack et al. | |
| 2010/0079416 A1* | 4/2010 | Chung ................ | G02F 1/13336 345/204 |
| 2010/0182207 A1* | 7/2010 | Miyata .................... | H01L 27/13 343/702 |
| 2015/0116065 A1 | 4/2015 | Jeong et al. | |
| 2016/0071919 A1* | 3/2016 | Chen .................... | G09G 3/3225 257/40 |
| 2016/0210899 A1* | 7/2016 | Hyun ................... | G09G 3/2085 |
| 2018/0286928 A1* | 10/2018 | Tong ................... | H01L 27/3227 |
| 2019/0296579 A1* | 9/2019 | Akatsuka ................ | H02J 50/40 |

FOREIGN PATENT DOCUMENTS

| | | |
|---|---|---|
| KR | 101510760 B1 | 4/2015 |
| KR | 1020150048551 A | 5/2015 |

* cited by examiner

*Primary Examiner* — Dmitriy Bolotin
(74) *Attorney, Agent, or Firm* — Cantor Colburn LLP

(57) ABSTRACT

A display device includes: a substrate; a plurality of pixels on the substrate; a pixel power supply unit between the plurality of pixels and the substrate, where the pixel power supply unit generates a power source voltage and supplies the power supply voltage to the plurality of pixels; and a display driver which drives the plurality of pixels.

20 Claims, 6 Drawing Sheets

DISPLAY DEVICE

This application claims priority to Korean Patent Application No. 10-2018-0039825, filed on Apr. 5, 2018, and all the benefits accruing therefrom under 35 U.S.C. § 119, the content of which in its entirety is herein incorporated by reference.

BACKGROUND

1. Field

Embodiments of the disclosure relate to a display device.

2. Description of the Related Art

A display device, such as a liquid crystal display ("LCD"), a plasma display panel ("PDP"), an organic light emitting diode ("OLED") device, a field effect display ("FED") and an electrophoretic display device, has been widely used in various fields.

Recently, such a display device has been developed to have a flexible, foldable or extendable structure.

SUMMARY

Embodiments provide a stretchable display device.

Embodiments provide a display device with uniform brightness.

Embodiments provide a display device with a reduced number of lines used for pixel driving.

Embodiments provide a display device with increased resolution.

According to an embodiment of the disclosure, a display device includes: a substrate; a plurality of pixels on the substrate; a pixel power supply unit between the plurality of pixels and the substrate, where the pixel power supply unit generates a power source voltage and supplies the power supply voltage to the plurality of pixels; and a display driver which drives the plurality of pixels.

In an embodiment, the display device may further include a buffer layer covering the pixel power supply unit, where each of the plurality of pixels may include a transistor, and the transistor may be in a form of a thin film on the buffer layer.

In an embodiment, the transistor may be electrically connected to the pixel power supply unit.

In an embodiment, the display device may further include a light source disposed below the substrate, and the pixel power supply unit may include a photovoltaic layer.

In an embodiment, the photovoltaic layer may generate power corresponding light emitted thereto from the light source.

In an embodiment, the photovoltaic layer may include at least one selected from cadmium telluride, copper indium diselenide, copper indium gallium diselenide, amorphous silicon and amorphous silicon germanium.

In an embodiment, the photovoltaic layer may be integrally formed as a single unitary and indivisible unit on the substrate.

In an embodiment, the display device may further include a light blocking layer disposed between the transistor and the buffer layer.

In an embodiment, the pixel power supply unit may include a coil layer.

In an embodiment, the substrate may have a shape defined by a plurality of island patterns spaced apart from each other and a plurality of bridge patterns connecting adjacent island patterns to each other.

In an embodiment, the coil layer may be disposed on each of the plurality of island patterns.

In an embodiment, the display device may further include a wire disposed on the plurality of bridge patterns and connecting adjacent coil layers to each other.

In an embodiment, each of the plurality of pixels includes a first sub-pixel, a second sub-pixel and a third sub-pixel, and the first sub-pixel, the second sub-pixel and the third sub-pixel may be disposed on each of the plurality of island patterns.

In an embodiment, the display device may further include a wireless power supply transmitter disposed below the substrate, wherein the wireless power supply transmitter wirelessly transmits power to the coil layer.

In an embodiment, the coil layer may receive power corresponding to the power source voltage from the wireless supply power transmitter by an electromagnetic induction.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
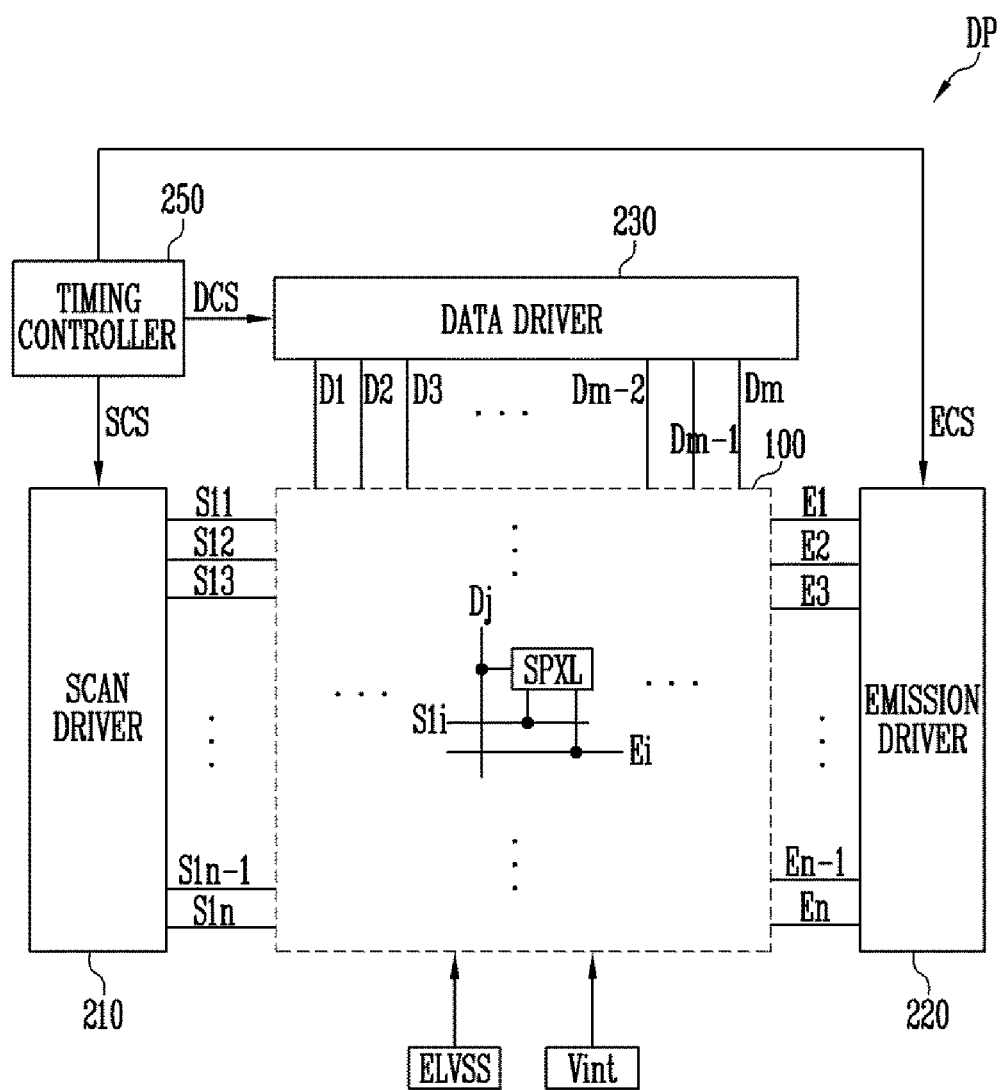
FIG. 1 is a diagram schematically illustrating configurations of a display panel included in a display device in accordance with an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "connected" or "coupled" to another element, it can be directly connected or coupled to the another element or be indirectly connected or coupled to the another element with one or more intervening elements interposed therebetween.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least A and B" means "A or B." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of a display device will be described in detail with reference to the accompanying drawings.

FIG. 1 is a diagram schematically illustrating configurations of a display panel included in a display device in accordance with an embodiment of the disclosure.

Referring to FIG. 1, an exemplary embodiment of a display panel DP may include a display unit 100 and a display driver. The display driver may include a scan driver 210, an emission driver 220, a data driver 230, and a timing controller 250.

The display unit 100 may include a plurality of pixels, and each of the plurality of pixels may include a plurality of sub-pixels SPXL.

The plurality of pixels may be disposed on a display area, and the display driver may be disposed on a non-display area which is a peripheral area of the display area.

Each of the plurality of pixels may include a first sub-pixel for expressing a first color, a second sub-pixel for expressing a second color, and a third sub-pixel for expressing a third color.

In an exemplary embodiment, the first color may be any one of red, green and blue. The second color may be any one of red, green, and blue, and may be different from the first color. The third color may be any one of red, green and blue, and may be different from the first color and the second color.

The sub-pixels SPXL may be coupled with, e.g., connected to, data lines D1 to Dm, scan lines S11 to S1$n$, and emission control lines E1 to En.

The sub-pixels SPXL may receive an initialization power source Vint from outside, e.g., an external device.

Each sub-pixel SPXL may be selected, e.g., turned on, when a scan signal is supplied to a corresponding one of the scan lines S11 to S1$n$ that is coupled therewith, and may then be supplied with a data signal from a corresponding one of the data lines D1 to Dm. The sub-pixel SPXL supplied with the data signal may control, in response to the data signal, the amount of current flowing to a light-emitting device (not shown) therein.

The light-emitting device may generate light having a predetermined luminance corresponding to the amount of current flowing thereto.

The timing controller 250 may generate a scan driving control signal SCS, a data driving control signal DCS, and an emission driving control signal ECS, based on signals input from an external device. The scan driving control signal SCS generated from the timing controller 250 may be supplied to the scan driver 210. The data driving control signal DCS generated from the timing controller 250 may be supplied to the data driver 230. The emission driving control signal ECS generated from the timing controller 250 may be supplied to the emission driver 220.

The scan driver 210 may supply scan signals to the scan lines S11 to S1$n$ in response to the scan driving control signal SCS. In one exemplary embodiment, for example, the scan driver 210 may sequentially supply the scan signals to the scan lines S11 to S1$n$, respectively.

Each scan signal may be set to a gate-on voltage (e.g., a low-level voltage) to turn on transistors included in the sub-pixels SPXL.

The data driver 230 may supply data signals to the data lines D1 to Dm in response to the data driving control signal DCS. The data signals supplied to the data lines D1 to Dm may be supplied to the sub-pixels SPXL when selected by the scan signals.

The emission driver 220 may supply emission control signals to the emission control lines E1 to En in response to the emission driving control signal ECS. In one exemplary embodiment, for example, the emission driver 220 may sequentially supply the emission control signals to the emission control lines E1 to En, respectively.

In an exemplary embodiment, when the emission control signals are supplied to the emission control lines E1 to En, the sub-pixels SPXL may not emit light. In such an embodiment, each emission control signal may be set to a gate-off voltage (e.g., a high-level voltage) to turn off transistors included in the sub-pixels SPXL.

In an exemplary embodiment, as illustrated in FIG. 1, the scan driver 210 and the emission driver 220 may be separate, but the disclosure is not limited thereto. In one alternative exemplary embodiment, for example, the scan driver 210 and the emission driver 220 may be integrally formed as a single driver.

The scan driver 210 and/or the emission driver 220 may be disposed on a substrate, e.g., mounted on the substrate through a thin film process.

The scan driver 210 and/or the emission driver 220 may be disposed at opposing sides while interposing the display unit 100 therebetween.

In an exemplary embodiment, as illustrated in FIG. 1, each sub-pixel SPXL may be coupled to a single scan line S1$i$, a single data line Dj, and a single emission control line Ei, but the disclosure is not limited thereto. In an alternative exemplary embodiment, depending on a circuit structure of each sub-pixel SPXL, a plurality of scan lines, among the scan lines S11 to S1$n$, may be coupled to each sub-pixel SPXL, or a plurality of emission control lines, among the emission control lines E1 to En, may be coupled to each sub-pixel SPXL.

In another alternative exemplary embodiment, the sub-pixels SPXL may be coupled to only the scan lines S11 to S1$n$ and the data lines D1 to Dm. In such an embodiment, the emission control lines E1 to En and the emission driver 220 for driving the emission control lines E1 to En may be omitted.

Figure 2:
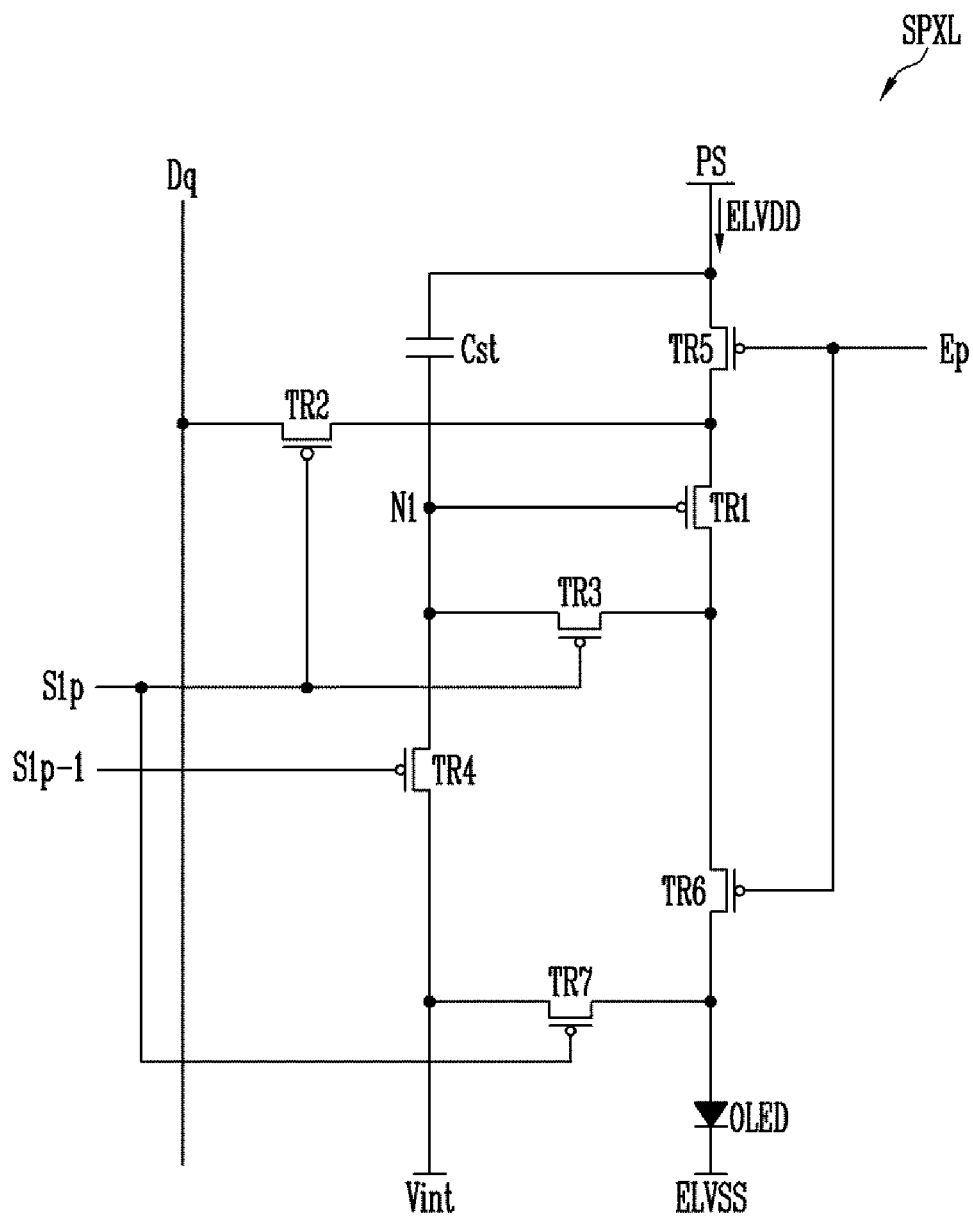
FIG. 2 is a diagram illustrating configurations of an exemplary embodiment of a sub-pixel shown in FIG. 1.

FIG. 2 is a diagram illustrating configurations of an exemplary embodiment of a sub-pixel SPXL shown in FIG. 1. For convenience of description, a sub-pixel SPXL connected to a p-th scan line S1$p$ and a q-th data line Dq is illustrated in FIG. 2. Here, p and q are natural numbers.

In an exemplary embodiment, as shown in FIG. 2, the sub-pixel SPXL may include a light emitting device OLED, first to seventh transistors TR1 to TR7, and a storage capacitor Cst.

An anode of the light emitting device OLED may be connected to the first transistor TR1 via the sixth transistor TR6, and a cathode of the light emitting device OLED may be electrically connected to a second power source ELVSS. The light emitting device OLED may generate light with a predetermined luminance corresponding to the amount of current supplied from the first transistor TR1.

A first power source ELVDD may be set to a voltage higher than that of the second power source ELVSS to allow a current to flow through the light emitting device OLED.

The seventh transistor TR7 may be connected between the initialization power source Vint and the anode of the light emitting device OLED. In such an embodiment, a gate electrode of the seventh transistor TR7 may be connected to the p-th scan line S1$p$. The seventh transistor TR7 may be turned on when a scan signal is supplied to the p-th scan line S1$p$, to supply the voltage of the initialization power source Vint to the anode of the light emitting device OLED. Here, the initialization power source Vint may be set to a voltage lower than that of a data signal.

In an exemplary embodiment, as show in FIG. 2, the seventh transistor TR7 is initialized in response to a scan signal supplied to the p-th scan line S1$p$, but the disclosure is not limited thereto. In one alternative exemplary embodiment, for example, the seventh transistor TR7 may be initialized in response to a scan signal supplied to a (p−1)-th scan line S1$p$−1 or a (p+1)-th scan line (not shown).

The sixth transistor TR6 may be connected between the first transistor TR1 and the light emitting device OLED. In such an embodiment, a gate electrode of the sixth transistor TR6 may be connected to a p-th emission control line Ep. The sixth transistor TR6 may be turned off when an emission control signal is supplied to the p-th emission control line Ep, and may be turned on otherwise.

The fifth transistor TR5 may be connected between a pixel power supply unit PS that supplies the first power source ELVDD and the first transistor TR1. In such an embodiment, a gate electrode of the fifth transistor TR5 may be connected to the p-th emission control line Ep. The fifth transistor TR5 may be turned off when the emission control signal is supplied to the p-th emission control line Ep, and may be turned on otherwise.

The pixel power supply unit PS may generate the first power source ELVDD and transmit the first power source ELVDD to the sub-pixel SPXL.

The pixel power supply unit PS may include a photovoltaic layer. Alternatively, the pixel power supply unit PS may include a coil unit for electromagnetic induction.

A first electrode of the first transistor TR1 (e.g., a driving transistor) may be connected to the fifth transistor TR5, and a second electrode of the first transistor TR1 may be connected to the anode of the light emitting device OLED via the sixth transistor TR6. In such an embodiment, a gate electrode of the first transistor TR1 may be connected to a first node N1. The first transistor TR1 may control the amount of current flowing to the light emitting device OLED, corresponding to a voltage of the first node N1.

The third transistor TR3 may be connected between the second electrode of the first transistor TR1 and the first node N1. In such an embodiment, a gate electrode of the third transistor TR3 may be connected to the p-th scan line S1$p$. The third transistor TR3 may be turned on when the scan signal is supplied to the p-th scan line S1$p$, to allow the second electrode of the first transistor TR1 and the first node N1 to be electrically connected to each other, such that the first transistor TR1 may be diode-coupled when the third transistor TR3 is turned on.

The fourth transistor TR4 may be connected between the first node N1 and the initialization power source Vint. In such an embodiment, a gate electrode of the fourth transistor TR4 may be connected to the (p−1)-th scan line S1$p$−1. The fourth transistor TR4 may be turned on when a scan signal is supplied to the (p−1)-th scan line S1$p$−1, to supply the voltage of the initialization power source Vint to the first node N1.

The second transistor TR2 may be connected between the q-th data line Dq and the first electrode of the first transistor TR1. In such an embodiment, a gate electrode of the second transistor TR2 may be connected to the p-th scan line S1p. The second transistor TR2 may be turned on when the scan signal is supplied to the p-th scan line S1p, to allow the q-th data line Dq and the first electrode of the first transistor TR1 to be electrically connected to each other.

The storage capacitor Cst may be connected between the pixel power supply unit PS and the first node N1. The storage capacitor Cst may store a voltage corresponding to the data signal and a threshold voltage of the first transistor TR1.

In such an embodiment, the first power supply ELVDD may be a high-potential power supply, and the second power supply ELVSS may be a low-potential power supply. In one exemplary embodiment, for example, the first power supply ELVDD may be set to a positive voltage, and the second power supply ELVSS may be set to a negative voltage or ground voltage.

In an exemplary embodiment of a display device in accordance with the disclosure, the first power supply ELVDD may be supplied from the pixel power supply unit PS in the display unit 100.

The first electrode of each of the transistors TR1, TR2, TR3, TR4, TR5, TR6, and TR7 may be set as either a source electrode or a drain electrode. The second electrode of each of the transistors TR1, TR2, TR3, TR4, TR5, TR6, and TR7 may be set to be different from the first electrode. In one exemplary embodiment, for example, the first electrode is set as the source electrode, and the second electrode may be set as the drain electrode.

In an exemplary embodiment, as illustrated in FIG. 2, the transistors TR1, TR2, TR3, TR4, TR5, TR6, and TR7 are p-type metal-oxide-semiconductor ("PMOS") transistors, but not being limited thereto. In an alternative exemplary embodiment, the transistors TR1, TR2, TR3, TR4, TR5, TR6, and TR7 may be n-type metal-oxide-semiconductor ("NMOS") transistors. Alternatively, some of the transistors TR1, TR2, TR3, TR4, TR5, TR6, and TR7 may be PMOS transistors and the remaining transistors may be NMOS transistors.

In such an embodiment, the structure of the sub-pixel SPXL is not limited to that shown in FIG. 2, and the structure of the sub-pixel SPXL may be variously changed.

Figure 3:
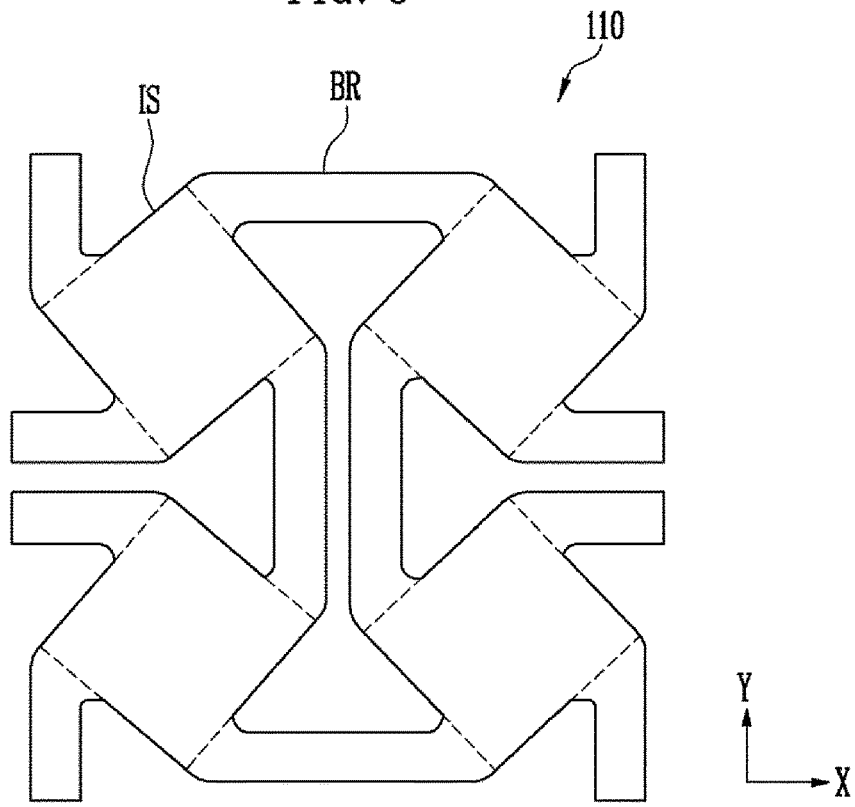
FIG. 3 is a plan view illustrating a part of a substrate in accordance with an embodiment of the disclosure.

FIG. 3 is a plan view illustrating a part of a substrate in accordance with an embodiment of the disclosure.

Referring to FIG. 3, in an exemplary embodiment, a substrate 110 may include or be divided into a plurality of island patterns IS and a plurality of bridge patterns BR.

In such an embodiment, the plurality of island patterns IS may be regularly arranged in first axis (X-axis) and second axis (Y-axis) directions.

Adjacent island patterns IS may be coupled with each other by at least one bridge pattern BR.

A pixel structure (e.g., a thin film transistor, a capacitor, and a light emitting device) may be disposed or formed on each island pattern IS.

In such an embodiment, wires for supplying a voltage of an initialization power source, a data signal, a scan signal and so forth to the corresponding pixel structure may be disposed on each bridge pattern BR.

In such an embodiment, when the display device is elongated or contracted, the distance between the island patterns IS may be increased or reduced. In such an embodiment, when the display device is elongated or contracted, the bridge patterns BR coupling the island patterns IS with each other may be deformed, but the shapes of the respective island patterns may not be deformed. Accordingly, in such an embodiment, each island pattern IS may not be increased or reduced in width and height. Hence, the structure of the pixel on the island pattern IS may also not be deformed.

Referring to FIG. 3, in one exemplary embodiment, for example, each island pattern IS has a rectangular shape, but the disclosure is not limited to this. In such an embodiment, the island pattern IS may have various shapes. The shape of each of the bridge patterns BR coupling the island patterns IS with each other may also vary without restriction.

Figure 4:
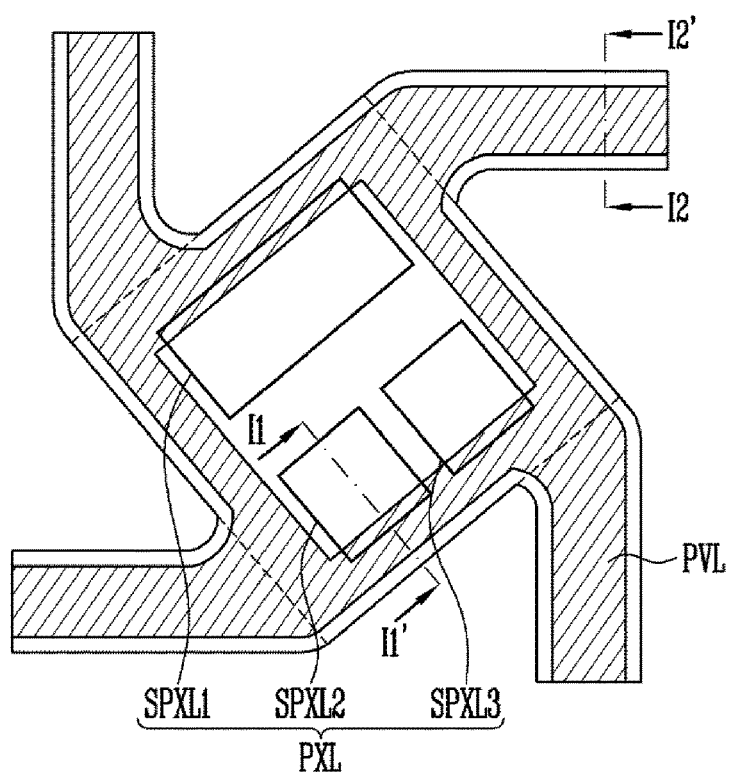
FIG. 4 is a plan view illustrating an exemplary embodiment of a display panel including a pixel and a photovoltaic layer disposed on an island pattern.

FIG. 4 is a plan view illustrating an exemplary embodiment of a display panel including the pixel and the photovoltaic layer disposed on the island pattern.

Referring FIG. 4, a photovoltaic layer PVL may be disposed on the island pattern IS. The photovoltaic layer PVL may convert light energy to electrical energy. The photovoltaic layer PVL may include at least one selected from cadmium telluride (CdTe), copper indium diselenide (CIS), copper indium gallium diselenide (CIGS), amorphous silicon (a-Si) and amorphous silicon germanium (a-SiGe).

Referring FIG. 4, a pixel PXL may be disposed on the island pattern IS. The pixel may include a first sub-pixel SPXL1, a second sub-pixel SPXL2 and a third sub-pixel SPXL3.

The first sub-pixel SPXL1, the second sub-pixel SPXL2, and the third sub-pixel SPXL3 may have a same circuit structure as each other. In one exemplary embodiment, for example, the first sub-pixel SPXL1, the second sub-pixel SPXL2, and the third sub-pixel SPXL3 may have the circuit structure shown in FIG. 2. The first sub-pixel SPXL1, the second sub-pixel SPXL2, and the third sub-pixel SPXL3 may emit light of colors different from each other.

The first sub-pixel SPXL1, the second sub-pixel SPXL2, and the third sub-pixel SPXL3 may be electrically connected to the photovoltaic layer PVL and receive the first power source ELVDD from the photovoltaic layer PVL.

Figure 5:
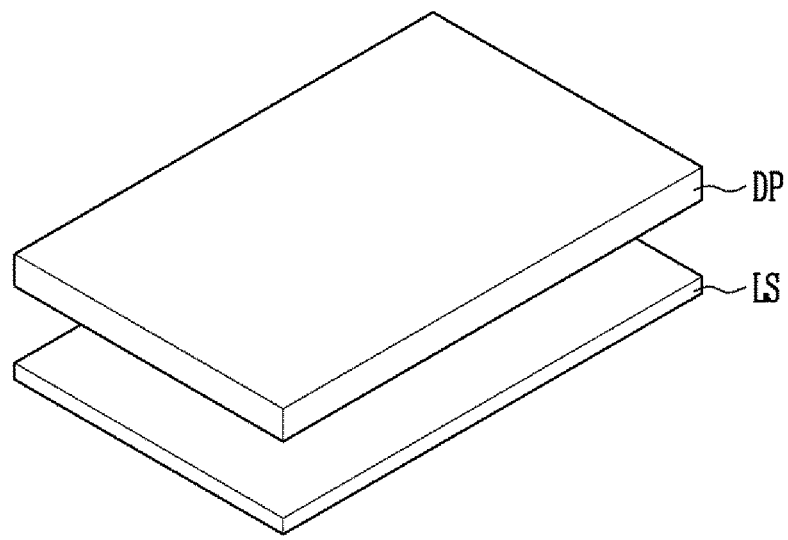
FIG. 5 is a diagram illustrating an exemplary embodiment of a display device including a light source.

FIG. 5 is a diagram illustrating an exemplary embodiment of a display device including a light source.

In an exemplary embodiment, the display device may include a light source LS such that the photovoltaic layer PVL included in the pixel power supply unit PS may generate the first power source ELVDD.

The light source LS may be disposed below or located at the bottom of the display panel DP, and may provide light to the display panel DP.

Referring to FIG. 5, in an exemplary embodiment, the light source LS has a plate shape, but the invention is not limited to this. In one alternative exemplary embodiment, for example, the light source LS may have a dot shape.

Referring to FIG. 5, in an exemplary embodiment of the display device, the light source LS is located at the bottom of the display panel DP, but the invention is not limited to this. In an alternative exemplary embodiment, where a display device including a pixel power supply unit includes a coil layer, a wireless power supply transmitter may be disposed at the bottom of the display panel DP. The wireless power supply transmitter may transmit a power to the display panel DP wirelessly, and may include a coil for forming a magnetic field with the coil layer included in the display panel DP.

Figure 6:
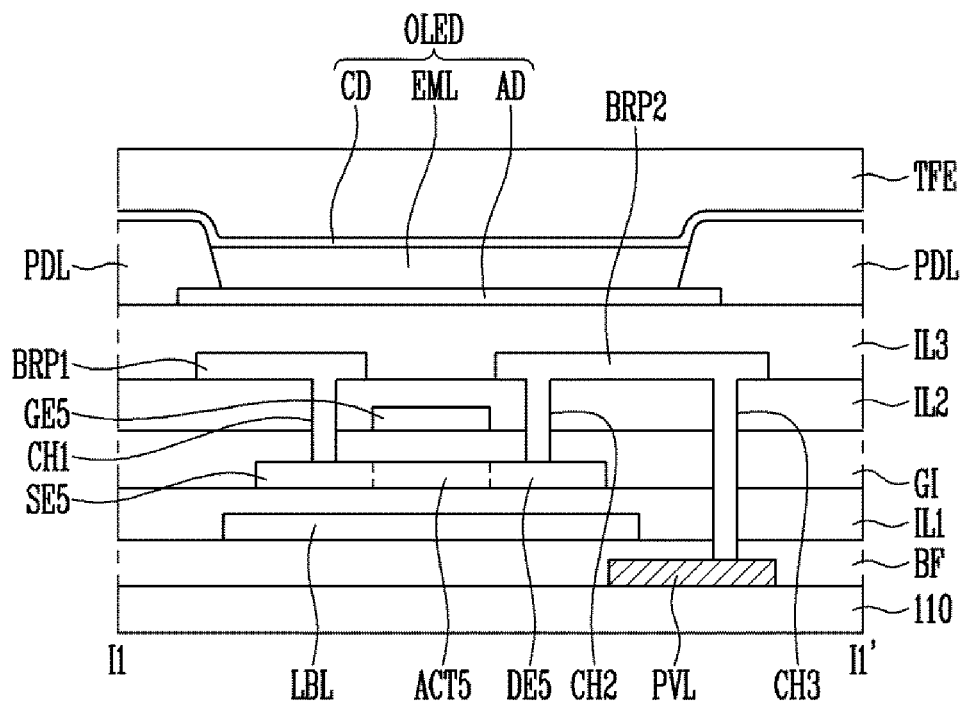
FIG. 6 is a cross-sectional view taken along line I1-I1' of FIG. 4.

FIG. 6 is a cross-sectional view taken along line I1-I1' of FIG. 4.

The substrate 110 having a shape defined by the island patterns IS and the bridge patterns BR, combined with each other, may include a transparent insulating material to allow light to be transmitted therethrough.

The substrate 110 may be a flexible substrate. In an exemplary embodiment, the substrate 110 may be a film substrate including a polymer organic material, or a plastic substrate. In one exemplary embodiment, for example, the substrate 110 may include at least one selected from polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate 110 may be variously changed. In one exemplary embodiment, for example, the substrate 110 may include a fiber reinforced plastic ("FRP").

Each of the transistors included in the display panel DP may be a thin film transistor disposed or formed on the substrate 110. Hereinafter, with reference to FIG. 6, the structure of the display panel DP will be described according to the stacking order of each structure. In particular, in order to explain the connection structure of the sub-pixels SPXL1, SPXL2, and SPXL3 and the photovoltaic layer PVL, the lamination structure of a transistor corresponding to the fifth transistor TR5 shown in FIG. 2 will herein be described with reference to FIG. 6.

The photovoltaic layer PVL may be disposed on the substrate 110. The photovoltaic layer PVL may be disposed to cover at least a part of the island pattern IS and the bridge pattern BR, and may be integrally formed as a single unitary and indivisible unit on the substrate 110, so that each pixel on the substrate 110 may be supplied with a voltage of the first power supply source ELVDD of a same magnitude.

A buffer layer BF may be disposed on the photovoltaic layer PVL. The buffer layer BF may include an inorganic material such as a silicon oxide, a silicon nitride, and/or a silicon oxynitride.

A light blocking layer LBL may be disposed on the buffer layer BF. The light blocking layer LBL may block light emitted from the light source LS provided under the display panel DP such that the emitted from the light source LS is effectively prevented from being supplied to an active layer of the transistor.

The light blocking layer LBL may include or be made of a metal. In such an embodiment, the metal may include molybdenum (Mo), or may include at least one selected from metals such as gold (Au), silver (Ag), aluminum (Al), chrome (Cr), titanium (Ti), nickel (Ni), neodymium (Nd), and copper (Cu), or an alloy thereof.

A first insulating layer IL1 may be disposed on the light blocking layer LBL.

An active pattern ACT5 may be disposed on the first insulating layer IL1. The active pattern ACT5 may include or be formed of semiconductor material.

A gate insulating layer GI may be disposed on the active pattern ACT5.

A gate electrode GE5 may be disposed on the gate insulating layer GI. In such an embodiment, scan lines, emission control lines, a lower electrode of a storage capacitor, and the like may be disposed on the gate insulating layer GI.

A second insulating layer IL2 may be disposed on the gate electrode GE5.

Conductive bridge patterns BRP1 and BRP2 may be disposed on the second insulating layer IL2. In such an embodiment, data lines, an upper electrode of a storage capacitor, an initialization power source line, and the like may be disposed on the second insulating layer IL2.

The first conductive bridge patterns BRP1 may be connected to a first electrode SE5 of the transistor via a first contact hole CH1 defined through the second insulating layer IL2 and the gate insulating layer GI.

The second conductive bridge patterns BRP2 may be connected to a second electrode DE5 of the transistor via a second contact hole CH2 defined through the second insulating layer IL2 and the gate insulating layer GI.

In an exemplary embodiment, the second conductive bridge patterns BRP2 may be connected to the photovoltaic layer PVL via a third contact hole CH3 defined through the second insulating layer IL2, the gate insulating layer GI, the first insulating layer IL1 and the buffer layer BF.

A third insulating layer IL3 may be disposed on the conductive bridge patterns BRP1 and BRP2.

The light emitting device OLED may be disposed on the third insulating layer IL3. The light emitting device OLED may include a first electrode AD, a second electrode CD, and a light emitting layer EML between the first electrode AD and the second electrode CD.

The first electrode AD may be disposed on the third insulating layer IL3.

A pixel defining layer PDL for defining a light emitting area corresponding to each of the sub-pixels SPXL1, SPXL2 and SPXL3 may be disposed on the substrate 110. The pixel defining layer PDL may include or define an opening, through which the upper surface of the first electrode AD is exposed. The pixel defining layer PDL may be protruded from the substrate 110 along edges of the sub-pixels SPXL1, SPXL2 and SPXL3.

The light emitting layer EML may be disposed in the light emitting area surrounded by the pixel defining layer PDL. The second electrode CD may be disposed on the light emitting layer EML.

The second electrode CD may be disposed to cover an entire surface, e.g., the entire upper surface, of the substrate 110. An encapsulation layer TFE covering the second electrode CD may be disposed on the second electrode CD.

One of the first electrode AD and the second electrode CD may be an anode electrode and the other electrode may be a cathode electrode. In one exemplary embodiment, for example, the first electrode AD may be the anode electrode, and the second electrode CD may be the cathode electrode.

The encapsulation layer TFE may effectively prevent oxygen and moisture from permeating into the light emitting device OLED. The encapsulation layer TFE may have a multi-layer structure including a plurality of inorganic layers (not shown) and/or a plurality of organic layers (not shown).

Figure 7:
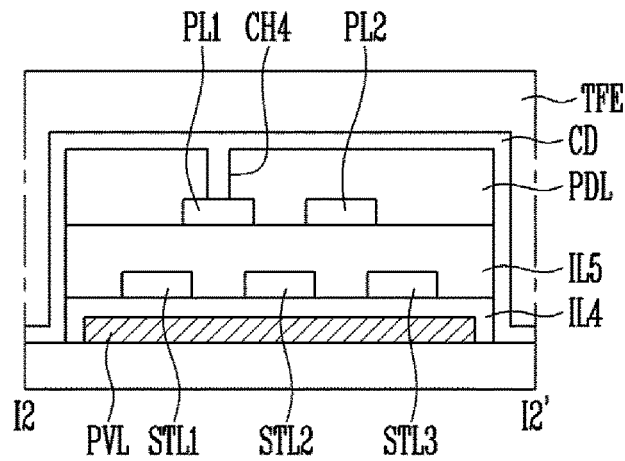
FIG. 7 is a cross-sectional view taken along line I2-I2' of FIG. 4.

FIG. 7 is a cross-sectional view taken along line I2-I2' of FIG. 4.

Referring FIGS. 4 and 7, the photovoltaic layer PVL may be disposed on the bridge pattern BR of the substrate 110.

A fourth insulating layer IL4 may be disposed on the photovoltaic layer PVL.

A first signal transmitting line STL1, a second signal transmitting line STL2 and a third signal transmitting line STL3 may be disposed on the fourth insulating layer IL4.

The first signal transmitting line STL1 may transmit emission control signals to the sub-pixels SPXL1, SPXL2 and SPXL3 on the island pattern IS.

The second signal transmitting line STL2 and the third signal transmitting line STL3 may transmit scan signals to the sub-pixels SPXL1, SPXL2 and SPXL3 on the island pattern IS. In one exemplary embodiment, for example, when the sub-pixels SPXL1, SPXL2 and SPXL3 are connected to an i-th emission control line, the second signal transmitting line STL2 may transmit an (i−1)-th scan signal and the third signal transmitting line STL3 may transmits an i-th scan signal.

The fourth insulating layer IL4 may be formed simultaneously with the third insulating layer IL3 disposed on the island pattern IS during a same manufacturing process.

A fifth insulating layer IL5 may be disposed on the first signal transmitting line STL1, the second signal transmitting line STL2 and the third signal transmitting line STL3.

A first power source line PL1 and a second power source line PL2 may be disposed on the fifth insulating layer IL5.

The first power source line PL1 may transmit the second power source ELVSS. The first power source line PL1 may be connected to the second electrode CD of the light emitting device OLED via a fourth contact hole CH4 defined through the fifth insulating layer IL5.

The second power source line PL2 may transmit the initialization power source Vint.

The pixel defining layer PDL may be disposed on the first power source line PL1 and the second power source line PL2. The second electrode CD may be disposed on the pixel defining layer PDL.

The encapsulation layer TFE covering the second electrode CD may be disposed on the second electrode CD.

When lines for supplying the first power source ELVDD, the second power source ELVSS, the initialization power source Vint, data signals, scan signals and the like are disposed on the bridge pattern BR having a smaller width than the island pattern IS, the lines may have a narrow width. However, when the width of the lines is substantially small, the lines may be disconnected while being elongated.

In an exemplary embodiment of the display device according to the invention, the pixel power supply unit PS is provided in each island pattern IS so that lines for transferring the first power supply ELVDD may not be provided on the bridge patterns BR. Accordingly, in such an embodiment, the number of lines on the bridge patterns BR may be reduced, and the width of the lines on the bridge patterns BR may be increased. Therefore, in such an embodiment, the disconnection of the lines on the bridge patterns BR while the bridge patterns BR elongated or contracted as described above may be effectively prevented.

In such an embodiment, images may be displayed with uniform luminance by reducing the number of the lines on the bridge patterns BR.

The insulating layers IL1 to IL5 illustrated in FIG. 6 and FIG. 7 may include an inorganic material, or an organic material such as polyimide, polyethylene terephthalate, polycarbonate, epoxy, polyethylene and polyacrylate, for example.

Figure 8:
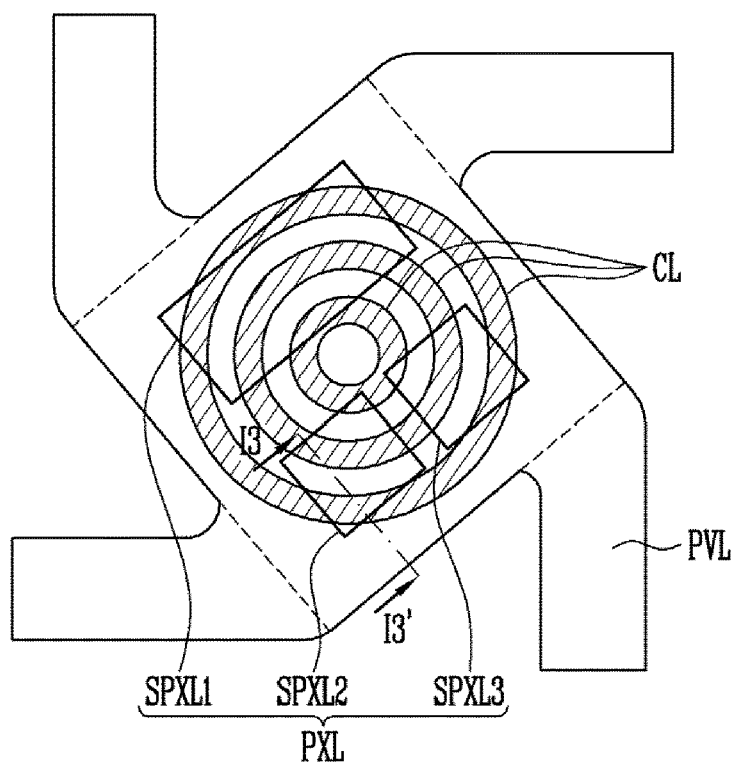
FIG. 8 is a plan view illustrating an alternative exemplary embodiment of a display panel including a pixel and a coil layer disposed on the island pattern.
Figure 9:
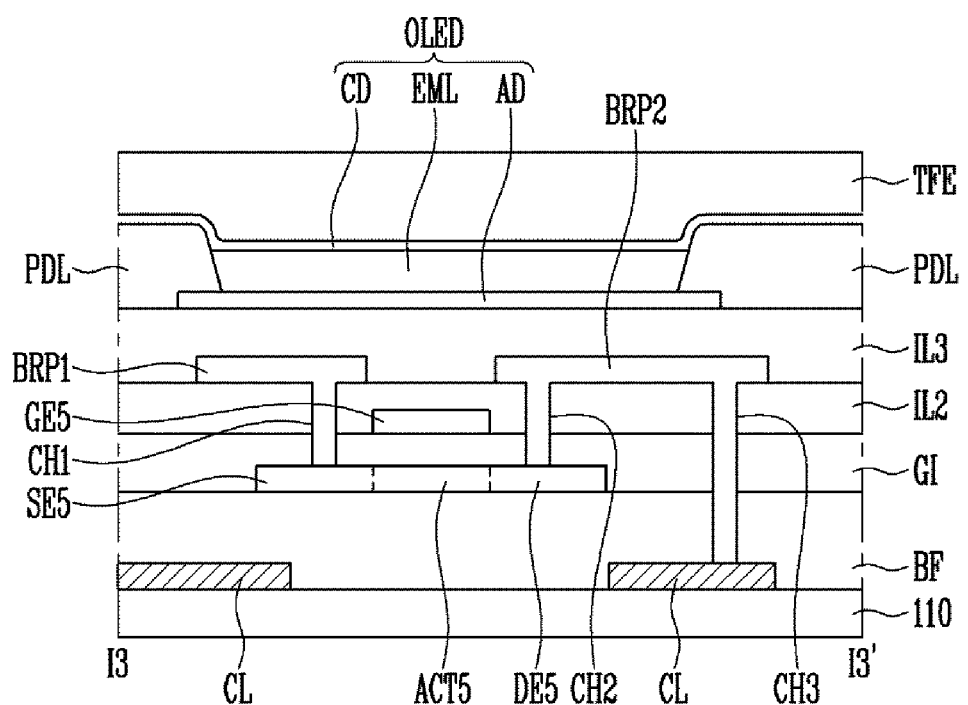
FIG. 9 is a cross-sectional view taken along line I3-I3' of FIG. 8.

FIG. 8 is a plan view illustrating an alternative exemplary embodiment of a display panel including the pixel and a coil layer disposed on the island pattern, and FIG. 9 is a cross-sectional view taken along line I3-I3' of FIG. 8. The views in FIGS. 8 and 9 are substantially the same as the views shown in FIGS. 4 and 6 except that a coil layer CL is provided instead of the photovoltaic layer PVL. The same or like elements shown in FIGS. 8 and 9 have been labeled with the same reference characters as used above to describe the exemplary embodiments of the display panel shown in FIGS. 4 and 6, and any repetitive detailed description thereof will hereinafter be omitted or simplified. Accordingly, hereinafter, a coil layer CL will be mainly described.

As described above, according to an alternative exemplary embodiment of the invention, the pixel power supply unit PS may include the coil layer CL instead of the photovoltaic layer PVL.

Referring FIGS. 8 and 9, the coil layer CL may be disposed on the island pattern IS. The first power supply ELVDD may be induced in the coil layer CL which is affected by the magnetic field.

The coil layers CL on each island pattern IS may be electrically connected to each other through connection wires (not shown).

In one exemplary embodiment, for example, the connection wires may be disposed on the bridge patterns BR, and may connect adjacent coil layers CL to each other.

The connection wires may be disposed between the substrate 110 and the fourth insulating layer IL4 as the photovoltaic layer PVL shown in FIG. 7.

As the coil layers CL are electrically connected to each other, each pixel provided on the substrate 110 may be supplied with the first power source ELVDD of a same magnitude.

The sub-pixels SPXL1, SPXL2 and SPXL3 on the island pattern IS may be electrically connected to the coil layer CL, and may receive the first power source ELVDD from the coil layer CL.

The buffer layer BF may be disposed on the coil layer CL. The active pattern ACT5 may be disposed on the buffer layer BF.

Referring FIG. 9, the second conductive bridge patterns BRP2 connected to the second electrode DE5 may be connected to the coil layer CL via the third contact hole CH3.

Although not shown in drawings, an exemplary embodiment of the display device according to the invention may further include a transmission coil layer for generating a magnetic field.

According to exemplary embodiments of the invention as described herein, a display panel including a stretchable substrate divided into islands and bridges includes a photovoltaic layer or a coil layer to provide a power source voltage to each pixel wirelessly, such that the number of the lines provided on the bridges having a relatively narrow width may be reduced to allow the widths of the lines to increase. Accordingly, in such embodiments, the disconnection of the lines on the bridge patterns while the bridge patterns elongated or contracted as described above is effectively prevented.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device, comprising:
   a substrate;
   a plurality of pixels on the substrate;
   a pixel power supply unit between the plurality of pixels and the substrate, wherein the pixel power supply unit generates a power source voltage and supplies the power source voltage to the plurality of pixels; and
   a display driver which drives the plurality of pixels,
   wherein the substrate has a shape defined by a plurality of island patterns spaced apart from each other and a plurality of bridge patterns connecting adjacent island patterns to each other.

2. The display device of claim 1, further comprising:
   a buffer layer covering the pixel power supply unit,
   wherein each of the plurality of pixels includes a transistor, and
   wherein the transistor is in a form of a thin film on the buffer layer.

3. The display device of claim 2, wherein the transistor is electrically connected to the pixel power supply unit.

4. The display device of claim 3, further comprising:
a light source disposed below the substrate,
wherein the pixel power supply unit comprises a photovoltaic layer.

5. The display device of claim 4, wherein the photovoltaic layer generates power corresponding to light emitted thereto from the light source.

6. The display device of claim 4, wherein the photovoltaic layer includes at least one selected from cadmium telluride, copper indium diselenide, copper indium gallium diselenide, amorphous silicon and amorphous silicon germanium.

7. The display device of claim 4, wherein the photovoltaic layer is integrally formed on the substrate.

8. The display device of claim 4, further comprising:
a light blocking layer disposed between the transistor and the buffer layer.

9. The display device of claim 3, wherein the pixel power supply unit comprises a coil layer.

10. The display device of claim 9, wherein the coil layer is disposed on each of the plurality of island patterns.

11. The display device of claim 10, further comprising:
a wire disposed on the plurality of bridge patterns and connecting adjacent coil layers to each other.

12. The display device of claim 10, wherein
each of the plurality of pixels includes a first sub-pixel, a second sub-pixel and a third sub-pixel, and
wherein the first sub-pixel, the second sub-pixel and the third sub-pixel are disposed on each of the plurality of island patterns.

13. The display device of claim 10, further comprising:
a wireless power supply transmitter disposed below the substrate, wherein the wireless power supply transmitter wirelessly transmits power to the coil layer.

14. The display device of claim 13, wherein the coil layer receives the power corresponding to the power source voltage from the wireless power supply transmitter by an electromagnetic induction.

15. A display device, comprising:
a substrate;
a plurality of pixels on the substrate;
a pixel power supply unit between the plurality of pixels and the substrate, wherein the pixel power supply unit generates a power source voltage and supplies the power source voltage to the plurality of pixels; and
a display driver which drives the plurality of pixels,
wherein the pixel power supply unit comprises a photovoltaic layer.

16. The display device of claim 15, further comprising:
a buffer layer covering the pixel power supply unit,
wherein each of the plurality of pixels includes a transistor, and
wherein the transistor is in a form of a thin film on the buffer layer.

17. The display device of claim 16, wherein the transistor is electrically connected to the pixel power supply unit.

18. The display device of claim 17, further comprising:
a light source disposed below the substrate,
wherein the photovoltaic layer generates power corresponding to light emitted thereto from the light source.

19. The display device of claim 17, wherein the photovoltaic layer includes at least one selected from cadmium telluride, copper indium diselenide, copper indium gallium diselenide, amorphous silicon and amorphous silicon germanium.

20. The display device of claim 17, wherein the substrate has a shape defined by a plurality of island patterns spaced apart from each other and a plurality of bridge patterns connecting adjacent island patterns to each other.

* * * * *